United States Patent
Lee

(10) Patent No.: US 8,697,489 B2
(45) Date of Patent: Apr. 15, 2014

(54) PACKAGE STRUCTURE AND PACKAGE PROCESS

(75) Inventor: Chien-Liang Lee, Taoyuan County (TW)

(73) Assignee: HTC Corporation, Taoyuan County (TW)

( * ) Notice: Subject to any disclaimer, the term of this patent is extended or adjusted under 35 U.S.C. 154(b) by 77 days.

(21) Appl. No.: 12/635,701

(22) Filed: Dec. 11, 2009

(65) Prior Publication Data

US 2011/0031605 A1 Feb. 10, 2011

(30) Foreign Application Priority Data

Aug. 6, 2009 (TW) ................................ 98126532 A

(51) Int. Cl.
*H01L 21/00* (2006.01)
(52) U.S. Cl.
USPC ........... 438/107; 428/109; 428/115; 428/120; 428/127; 428/118; 257/777; 257/730; 257/686; 257/690; 257/687
(58) Field of Classification Search
USPC .......... 257/690, 686, 687, E21.509, E23.023; 438/108, 121
See application file for complete search history.

(56) References Cited

U.S. PATENT DOCUMENTS

| | | | | |
|---|---|---|---|---|
| 6,121,689 | A * | 9/2000 | Capote et al. | 257/783 |
| 6,420,213 | B1 * | 7/2002 | Nakajyo et al. | 438/118 |
| 6,420,216 | B1 | 7/2002 | Clevenger et al. | |
| 2003/0096453 | A1 * | 5/2003 | Wang et al. | 438/108 |
| 2003/0170444 | A1 * | 9/2003 | Stewart et al. | 428/317.7 |
| 2004/0232210 | A1 | 11/2004 | Shah et al. | |
| 2005/0051885 | A1 * | 3/2005 | Weng et al. | 257/687 |
| 2006/0024863 | A1 * | 2/2006 | Chung | 438/107 |
| 2007/0120243 | A1 * | 5/2007 | Yanagisawa et al. | 257/686 |
| 2007/0170586 | A1 | 7/2007 | Lee et al. | |
| 2007/0170599 | A1 | 7/2007 | Amagai et al. | |
| 2007/0259481 | A1 * | 11/2007 | Chung | 438/108 |
| 2008/0061312 | A1 * | 3/2008 | Gao et al. | 257/99 |

FOREIGN PATENT DOCUMENTS

TW 533507 5/2003

OTHER PUBLICATIONS

"European Search Report of Europe Counterpart Application," Issued on Jul. 26, 2010, p. 1-p. 3.
"First Office Action of Europe Counterpart Applition," Issued on Aug. 17, 2010, p. 1-p. 7.
Li Li, et al., "Pb-free solder paste reflow window study for flip chip wafer bumping", IEEE, 2001 International Symposium on Advanced Packaging Materials: Processes, Properties and Interfaces, Mar. 2001, pp. 112-118.
"Office Action of Europe Counterpart Application", issued on Aug. 23, 2012, p. 1-p. 11, ("Pb-free solder paste reflow window study for flip chip wafer bumping").
"Office Action of Taiwan Counterpart Application", issued on Mar. 11, 2013, p. 1-p. 7.

* cited by examiner

*Primary Examiner* — Asok K Sarkar
*Assistant Examiner* — Dmitriy Yemelyanov
(74) *Attorney, Agent, or Firm* — Jianq Chyun IP Office

(57) ABSTRACT

A package structure and a package process are provided. In the package process, firstly, a first electronic component having a plurality of first conductive bumps at a bottom thereof is provided. Then, a first insulation paste is coated on the first conductive bumps. The first electronic component is disposed on a circuit substrate having a plurality of substrate pads, and the first conductive bumps are respectively situated on the substrate pads. Next, a heating process is performed to both of the first conductive bumps and the first insulation paste, wherein the first conductive bumps is reflowed to bond the first electronic component and the substrate pads, and the first insulation paste is cured.

6 Claims, 7 Drawing Sheets

PACKAGE STRUCTURE AND PACKAGE PROCESS

CROSS-REFERENCE TO RELATED APPLICATION

This application claims the priority benefit of Taiwan application serial No. 98126532, filed on Aug. 6, 2009. The entirety of the above-mentioned patent application is hereby incorporated by reference herein and made a part of this specification.

BACKGROUND OF THE INVENTION

1. Field of the Invention

The present application relates to a package structure and a fabrication method thereof. More particularly, the present application relates to a package structure integrating curing of an insulation paste and reflow of conductive bumps in a same heating process, and a fabrication method thereof.

2. Description of Related Art

Recently, with quick development of the integrated circuit (IC) technique and material technique, a size of a chip in the IC is gradually reduced, though a function thereof is increasingly improved, so that application of the IC technique is widespread. Therefore, products, such as handheld electronic devices, electronic dictionaries, digital cameras and various digital products, etc., manufactured according to the IC technique have a general trend of lightness, slimness, shortness and smallness.

The surface mounting technology (SMT) is a commonly used technique for mounting an electronic component or other components to a circuit board. According to the SMT, a size of a whole package structure can be reduced, which avails miniaturization of an electronic apparatus.

According to the known SMT, a reflow step is performed to conductive bumps between the electronic component and the circuit board after the electronic component is mounted to the circuit board, so that the conductive bumps may have a melted state or a semi-melted state to bond the electronic component and the circuit board. Then, an underfill is filled between the electronic component and the circuit board, and a curing step is performed to the underfill. Generally, a reflow temperature of the conductive bumps is required to be higher than a melting point of the conductive bumps, and a heating temperature for curing the underfill is far lower than the reflow temperature of the conductive bumps.

However, according to the known SMT, after the conductive bumps are reflowed, an underfill process is further performed, and steps thereof are quite complicated, which may influence a production yield. Moreover, since a fabrication condition of curing the underfill is different to a fabrication condition of reflowing the conductive bumps, two fabrication equipments have to be used, which may increase a production cost.

On the other hand, according to the known SMT, a method of forming the underfill is that after the electronic component is mounted to the circuit board, a dispensing step is performed outside a junction of the electronic component and the circuit board, so that the underfill can enter a space between the electronic component and the circuit board to wrap the conductive bumps according to a siphon phenomenon. Though, a part of the underfill is remained outside the electronic component according to such dispensing method, which may influence an appearance of the package structure.

SUMMARY OF THE INVENTION

The present application is directed to a package process, which has simple process steps, so that production efficiency can be improved.

The present application is directed to a package structure, which can avoid exposing an underfill, so that an appearance of a product is improved.

The present application provides a package process. First, a first electronic component having a plurality of first conductive bumps at a bottom thereof is provided. Next, a first insulation paste is coated on the first conductive bumps. Next, the first electronic component is disposed on a circuit substrate having a plurality of substrate pads, and the first conductive bumps are respectively situated on the substrate pads. Next, a heating process is performed to both of the first conductive bumps and the first insulation paste, so that the first conductive bumps are reflowed to bond the first electronic component and the substrate pads, and the first insulation paste is cured.

The present application further provides a package structure including a circuit substrate, a first electronic component, a plurality of first conductive bumps and a first insulation paste. The circuit substrate has a plurality of substrate pads, and the first electronic component is disposed on the circuit substrate. The first conductive bumps are disposed between the first electronic component and the circuit substrate, wherein each of the first conductive bumps is connected to the first electronic component and the corresponding substrate pad. The first insulation paste is disposed between the first electronic component and the circuit substrate. Moreover, the first electronic component has a first vertical projection region on the circuit substrate, and the first insulation paste is located in the first vertical projection region.

According to the package process of the present application, the conductive bumps are reflowed and the insulation paste is cured by performing a same heating process. Comparing to a conventional technique forming the underfill after the electronic component is mounted, the package process of the present application is simple, and therefore a problem of poor production yield caused by complicated process steps can be avoided, and process equipments, materials and labour cost can be reduced to improve production efficiency. On the other hand, since the package process forms the insulation paste on the conductive bumps before the electronic component is mounted, the insulation paste is not exposed outside the electronic component after the electronic component is mounted and the heating process is performed, so that the package structure may have a better appearance.

In order to make the aforementioned and other features and advantages of the present application comprehensible, several exemplary embodiments accompanied with figures are described in detail below.

BRIEF DESCRIPTION OF THE DRAWINGS

The accompanying drawings are included to provide a further understanding of the application, and are incorporated in and constitute a part of this specification. The drawings illustrate embodiments of the application and, together with the description, serve to explain the principles of the application.

DESCRIPTION OF THE EMBODIMENTS

In the present application, before an electronic component is mounted, an insulation paste having a liquid state or a semi-solid state is first coated on conductive bumps, and after the electronic component is mounted, the insulation paste is cured while the conductive bumps are reflowed. In other words, in the present application, only one heating process is performed to reflow the conductive bumps and cure the insulation paste simultaneously, wherein a temperature of the heating process is controlled within a range that the conductive bumps may have a melted state or a semi-melted state. For example, a material of the conductive bumps can be a lead-free solder, and the temperature of the heating process is, for example, between 200° C. and 260° C.

Moreover, the package process of the present application can be applied to a package structure with a single electronic component, or can be applied to a package on package (POP) structure. In other words, the aforementioned heating process used for curing the insulation paste and reflowing the conductive bumps can be used to bond the electronic component to a circuit substrate, and can also be used to bond the electronic components of the POP structure.

Embodiments are provided below to describe the package process and the package structure of the present application.

Figure 1:
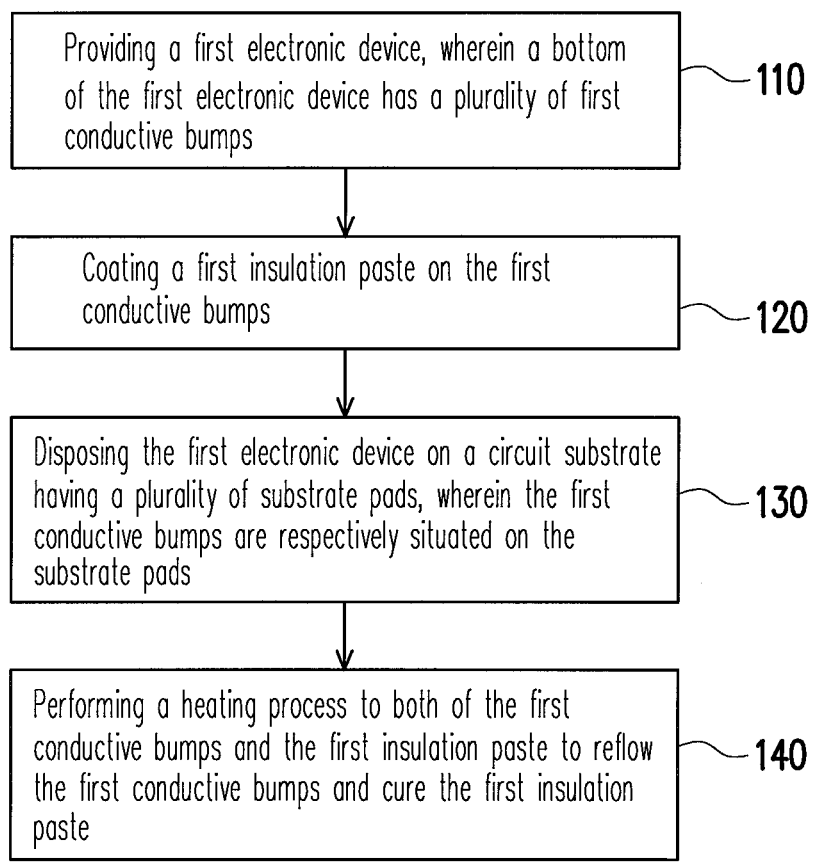
FIG. 1 is a flowchart illustrating a package process according to an embodiment of the present application.

FIG. 1 is a flowchart illustrating a package process according to an embodiment of the present application. FIGS. 2A-2D are diagrams sequentially illustrating steps of a package process of FIG. 1.

Figure 2A:
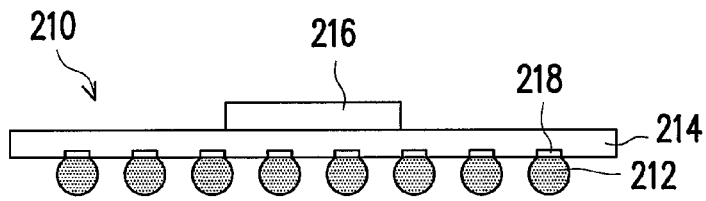
FIGS. 2A-2D are diagrams sequentially illustrating steps of a package process of FIG. 1.

First, as shown in step 110 and FIG. 2A, a first electronic component 210 is provided, the first electronic component 210 has a plurality of first conductive bumps 212 at a bottom thereof. Here, the first electronic component 210 is, for example, a packaged central processing unit (CPU) including a first carrier 214 and a first chip 216 located on the first carrier 214. The first conductive bumps 212 are located on the bottom of the first carrier 214, and the first conductive bumps 212 are, for example, ball-shape solder bumps arranged in an array, and are formed on a plurality of solder pads 218 on the bottom of the first carrier 214, so as to be electrically connected to the first chip 216 through the first carrier 214. Here, the first conductive bumps 212 are, for example, lead-free tin balls.

Figure 2B:
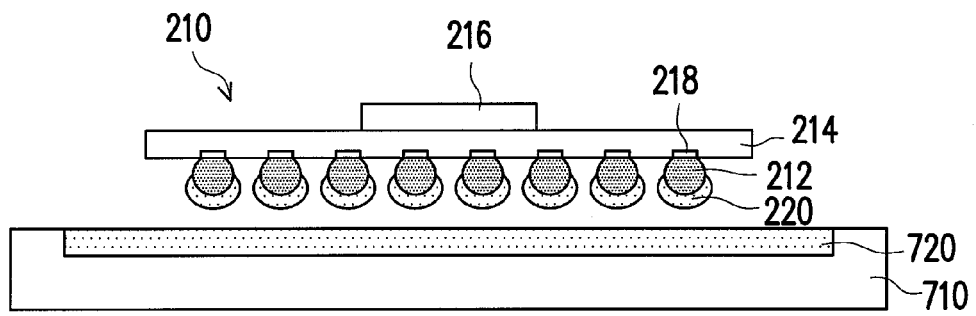

Next, as shown in step 120 and FIG. 2B, a first insulation paste 220 is coated on the first conductive bumps 212. In the present embodiment, the first conductive bumps 212 of the first electronic component 210 are, for example, disposed in insulation paste solution 720 contained by a container 710 according to a dipping method, so that each of the first conductive bumps 212 is coated by the first insulation paste 220. An advantage of the dipping method is that the processing is simple and quick. Certainly, the method for coating the first insulation paste 220 on the first conductive bumps 212 is not limited thereto, and those with ordinary skill in the art can apply other methods such as printing and spraying, etc. to form the first insulation paste 220 on the first conductive bumps 212 according to an actual demand.

Figure 2C:
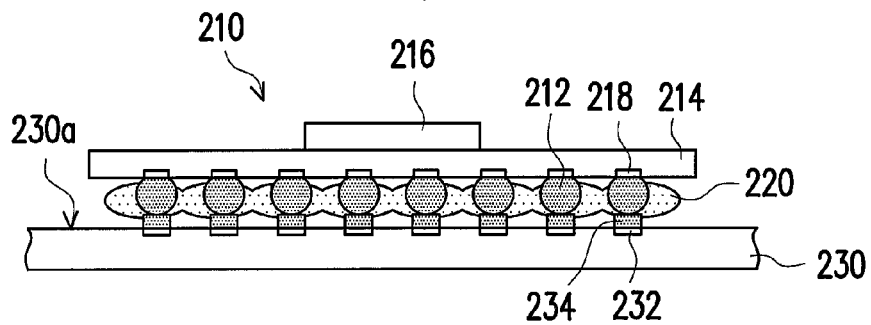

Next, as shown in step 130 and FIG. 2C, the first electronic component 210 is disposed on a circuit substrate 230. In the present embodiment, a carrying surface 230a of the circuit substrate 230 has a plurality of substrate pads 232 corresponding to the first conductive bumps 212. The first electronic component 210 is disposed on the carrying surface 230a, and the first conductive bumps 212 are respectively situated on the substrate pads 232. In the present embodiment, before the step 130, a pre-solder 234 can be formed on each of the substrate pads 232 to improve a bonding effect of the first conductive bumps 212 in a follow-up process. The pre-solder 234 is, for example, a solder paste formed by printing.

Figure 2D:
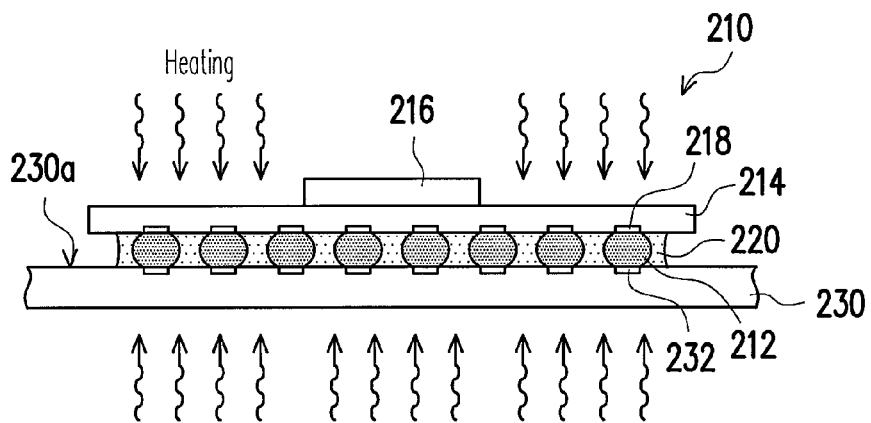

Next, as shown in step 140 and FIG. 2D, a heating process is performed to both of the first conductive bumps 212 and the first insulation paste 220 to reflow the first conductive bumps 212 and cure the first insulation paste 220. The first conductive bumps 212 may have a melted state or a semi-melted state when being reflowed, so as to be respectively bonded to the solder pads 218 on the bottom of the first electronic component 210 and the substrate pads 232 of the circuit substrate 230, and the first conductive bumps 212 are connected to the solder pads 218 and the corresponding substrate pads 232 after being cooled down. Moreover, as describe above, if the pre-solder 234 is first formed on each of the substrate pads 232, the first conductive bumps 212 can be respectively integrated with the corresponding pre-solders 234 when being reflowed. On the other hand, after the first electronic component 210 is bonded to the circuit substrate 230, the first insulation paste 220 is filled in spaces among the first conductive bumps 212 for wrapping the first conductive bumps 212, and is cured during the heating process. However, the first insulation paste 220 is not limited to be filled in the spaces among the first conductive bumps 212, i.e. the first insulation paste 220 can be only filled in a part of the spaces among the first conductive bumps 212 without totally wrapping the first conductive bumps 212. Furthermore, in an actual package process, internal of the first insulation paste 220 probably contains air bubbles.

During the actual package process, a temperature of the heating process is determined according to materials of the first conductive bumps 212 and the first insulation paste 220. Since a melting point of the first conductive bump 212 is generally higher than a curing temperature of the first insulation paste 220, the temperature of the heating process is required to be higher than the melting point of the first conductive bumps 212. In the present embodiment, the material of the first conductive bumps 212 is, for example, a lead-free solder, and the temperature of the heating process is, for example, between 200° C. and 260° C.

In the present embodiment, before the first electronic component 210 is bonded to the circuit substrate 230, the first insulation paste 220 is first coated on the first conductive bumps 212, and after the first electronic component 210 is bonded to the circuit substrate 230, only one heating process is performed to complete reflowing the first conductive bumps 212 and curing the first insulation paste 220. In other words, the first conductive bumps 212, for example, maintain a solid state before the heating process, and the first conductive bumps 212 are bonded to the first electronic component 210 and the circuit substrate 230 when the heating process is performed.

In the package process of the present embodiment, only one heating process is performed to reflow the conductive bumps and cure the insulation paste, so that process steps can be simplified to reduce a problem of poor production yield, and process equipments, materials and labour cost can be reduced to improve production efficiency.

Figure 3:
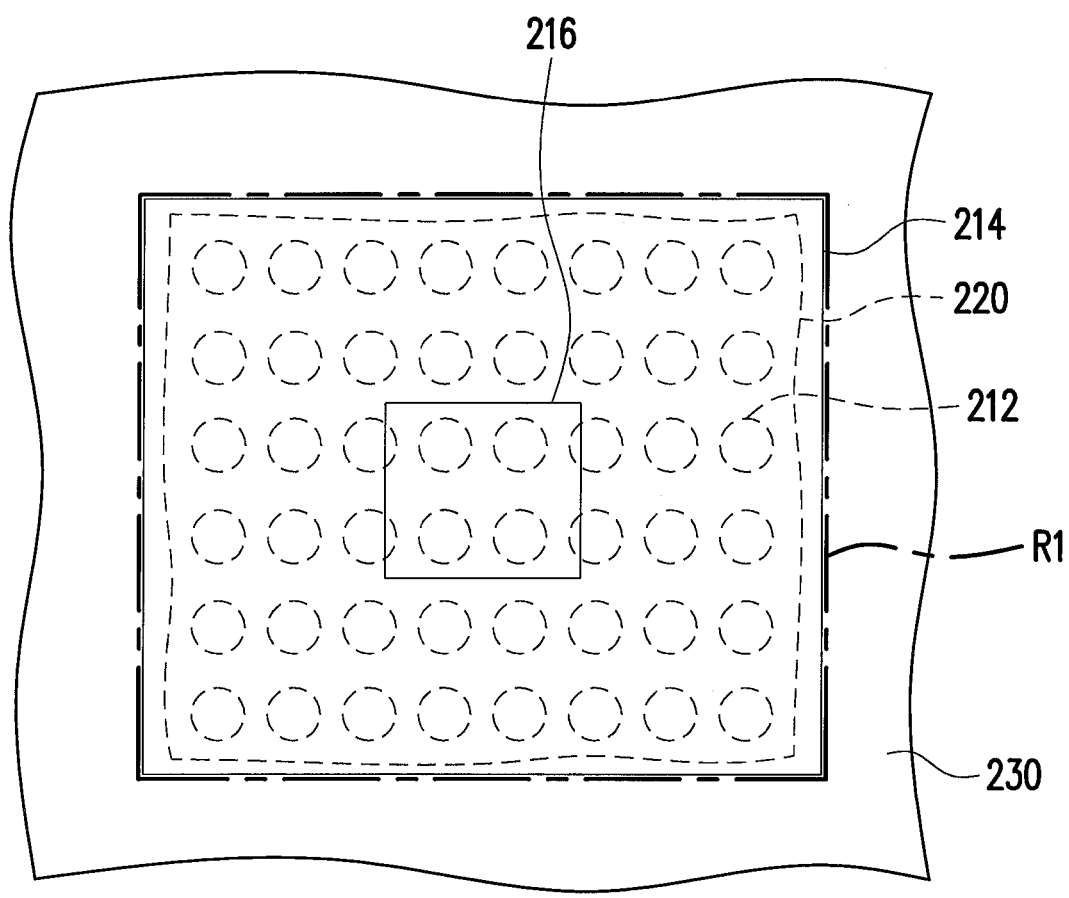
FIG. 3 is a top view of a package structure according to an embodiment of the present application.

FIG. 3 is a top view of the aforementioned package structure. As shown in FIG. 3, since in the package structure formed according to the aforementioned package process, the first insulation paste 220 is formed on the first conductive bumps 212 before the first electronic component 210 is bonded to the circuit substrate 230, after the first electronic component 210 is bonded to the circuit substrate 230, and the heating process is performed, the first insulation paste 220 can enter spaces among the first conductive bumps 212 without being exposed outside the first electronic component 210. In other words, the first electronic component 210 has a first vertical projection region R1 on the circuit substrate 230, and the first insulation paste 220 is located within the first vertical projection region R1. Therefore, a problem of remaining the underfill outside the electronic component due to a conventional dispensing step can be resolved, so that the appearance of the package structure can be greatly improved.

Based on the aforementioned embodiment, the POP package process can also be simplified according to the present application.

Figure 4:
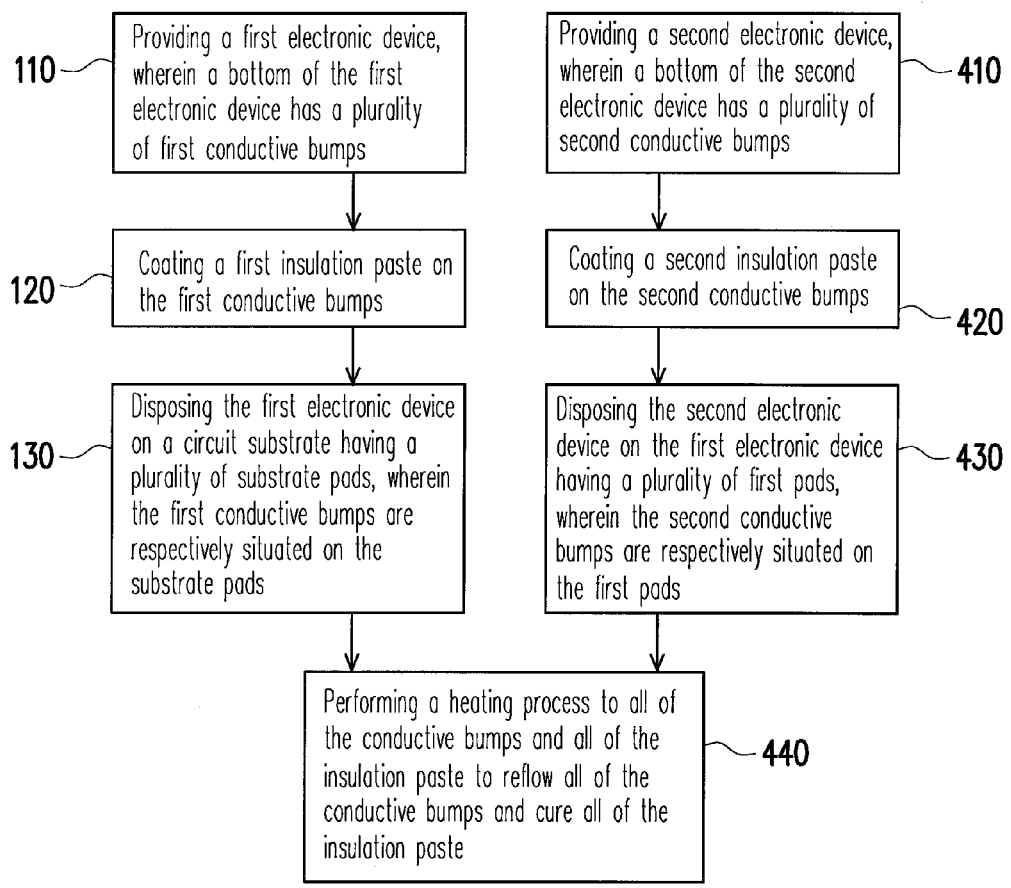
FIG. 4 is a flowchart illustrating a package process according to another embodiment of the present application.

FIG. 4 is a flowchart illustrating a package process according to another embodiment of the present application. FIGS. 5A-5F are diagrams sequentially illustrating steps of the package process of FIG. 4.

Figure 5A:
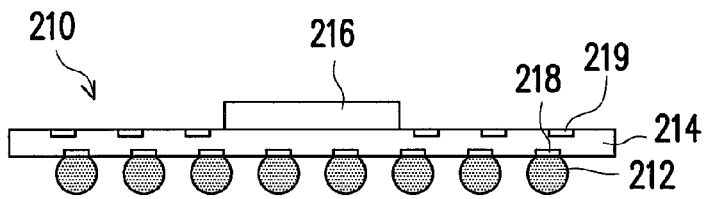
FIGS. 5A-5F are diagrams sequentially illustrating steps of a package process of FIG. 4.
Figure 5B:
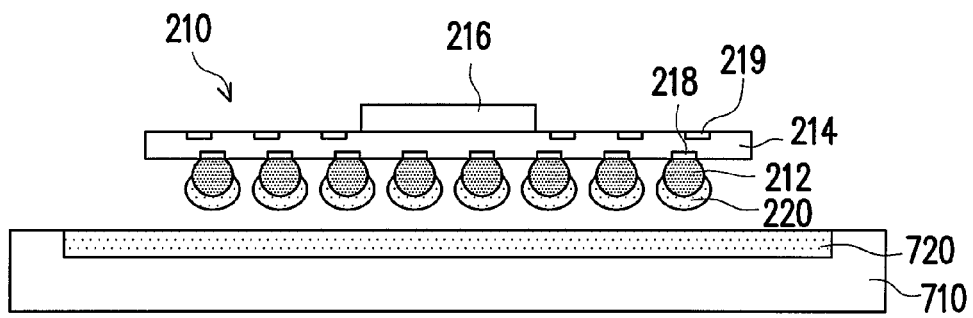
Figure 5C:
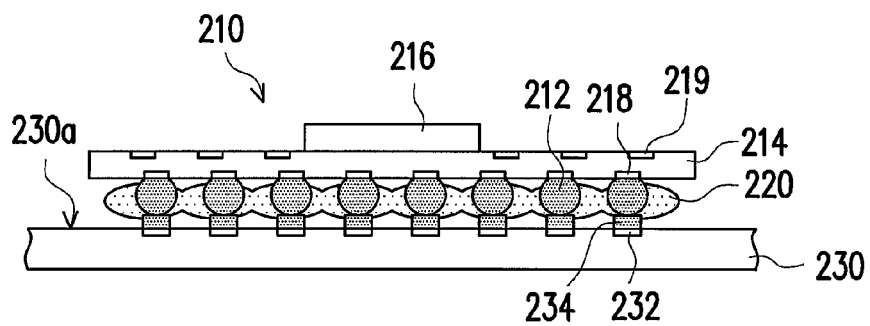

First, as described in the steps 110-130 of the aforementioned embodiment, the first electronic component 210 is provided (referring to FIG. 5A), the first insulation paste 220 is coated on the first conductive bumps 212 located at the bottom of the first electronic component 210 (referring to FIG. 5B), and the first electronic component 210 is disposed on the circuit substrate 230 (referring to FIG. 5C). Since the above steps are similar to that of the aforementioned embodiment, same reference numerals are used to denote the steps and the devices, and related technical descriptions are not repeated. Though, since a second electronic component is required to be stacked on the first electronic component 210 in the present embodiment, the first electronic component 210 further has a plurality of first pads 219 for bonding the second electronic component.

Figure 5D:
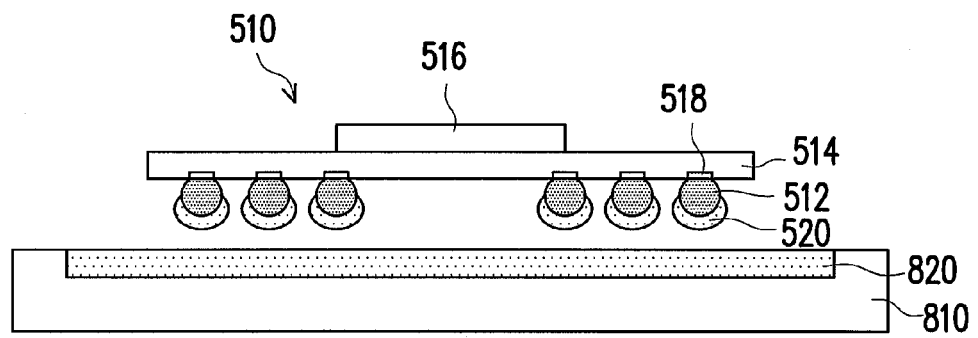

As shown in step 410 and FIG. 5D, the present embodiment provides a second electronic component 510. The second electronic component 510 has a plurality of second conductive bumps 512 at a bottom thereof. Here, the second electronic component 510 is, for example, a packaged memory unit including a second carrier 514 and a second chip 516 located on the second carrier 514. The second conductive bumps 512 are located on the bottom of the second carrier 514, and the second conductive bumps 512 are, for example, ball-shape solder bumps arranged in an array, and are formed on a plurality of solder pads 518 on the bottom of the second carrier 514, so as to be electrically connected to the second chip 516 through the second carrier 514. Here, the second conductive bumps 512 are, for example, lead-free tin balls.

Moreover, as shown in step 420 and FIG. 5D, a second insulation paste 520 is coated on the second conductive bumps 512. In the present embodiment, the second conductive bumps 512 of the second electronic component 510 are, for example, disposed in insulation paste solution 820 contained by a container 810 according to the dipping method, so that each of the second conductive bumps 512 is coated by the second insulation paste 520. A material of the second insulation paste 520 can be the same or different to that of the first insulation paste 220 to meet different design requirements. For example, a material cost can be reduced, and setting of process parameters can be simplified by using the same material, while effects for buffering stress at the junction and strengthening a bonding strength can be achieved by using different materials.

Figure 5E:
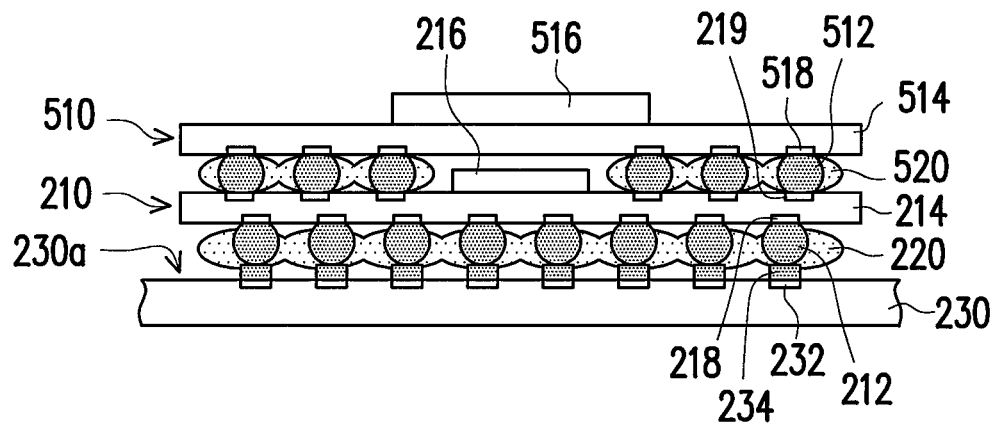

Next, as shown in step 430 and FIG. 5E, the second electronic component 510 is disposed on the first electronic component 210, wherein the second conductive bumps 512 are respectively situated on the first pads 219.

Figure 5F:
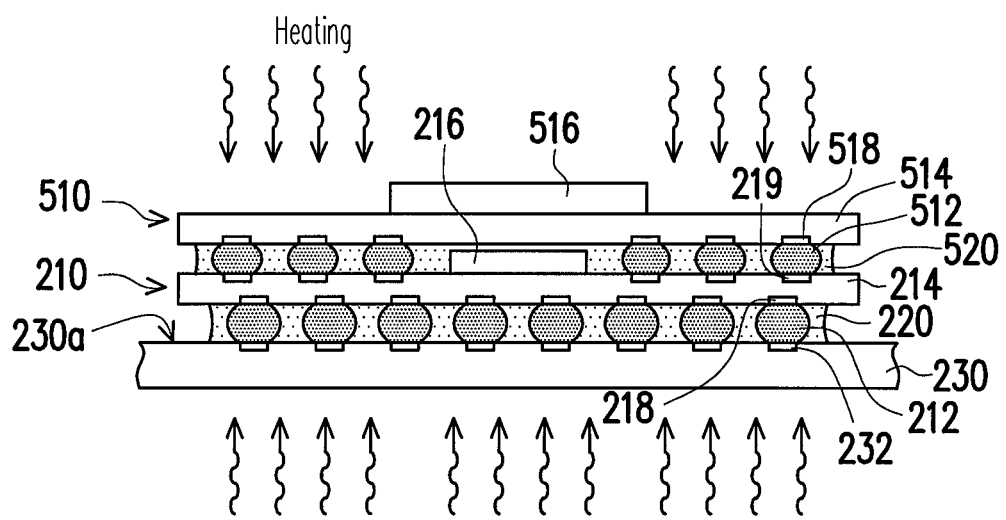

Next, as shown in step 440 and FIG. 5F, a heating process is simultaneously performed to the first conductive bumps 212, the first insulation paste 220, the second conductive bumps 512 and the second insulation paste 520 to reflow the first conductive bumps 212 and the second conductive bumps 512, and cure the first insulation paste 220 and the second insulation paste 520. The first conductive bumps 212 may have a melted state or a semi-melted state when being reflowed, so as to be respectively bonded to the solder pads 218 on the bottom of the first electronic component 210 and the substrate pads 232 of the circuit substrate 230, and the first conductive bumps 212 are connected to the solder pads 218 and the corresponding substrate pads 232 after being cooled down. Moreover, as described above, if the pre-solder 234 is first formed on each of the substrate pads 232, the first conductive bumps 212 can be respectively integrated with the corresponding pre-solders 234 when being reflowed.

The second conductive bumps 512 may have the melted state or the semi-melted state when being reflowed, so as to be respectively bonded to the solder pads 518 on the bottom of the second electronic component 510 and the first pads 219 on the top of the first electronic component 210, and the second conductive bumps 512 are connected to the solder pads 518 and the corresponding first pads 219 after being cooled down.

On the other hand, as described in the aforementioned embodiment, after the first electronic component 210 is bonded to the circuit substrate 230, the first insulation paste 220 enters the spaces among the first conductive bumps 212, and is cured during the heating process.

Moreover, after the second electronic component 510 is bonded to the first electronic component 210, the second insulation paste 520 enters the spaces among the second conductive bumps 512 for wrapping the second conductive bumps 512, and is cured during the heating process. Similarly, the second insulation paste 520 is not limited to be filled in the spaces among the second conductive bumps 512, i.e. the second insulation paste 520 can be only filled in a part of the spaces among the second conductive bumps 512 without totally wrapping the second conductive bumps 512. Alternatively, in an actual package process, internal of the second insulation paste 520 probably contains air bubbles.

During the actual package process, a temperature of the heating process is determined according to materials of the first conductive bumps 212, the second conductive bumps 512, the first insulation paste 220 and the second insulation paste 520. Since the melting point of the first conductive bumps 212 is generally higher than the curing temperature of the first insulation paste 220, and a melting point of the second conductive bumps 512 is generally higher than a curing temperature of the second insulation paste 520, the temperature of the heating process is required to be higher than the melting points of the first conductive bumps 212 and the second conductive bumps 512. In the present embodiment, the materials of the first conductive bumps 212 and the second conductive bumps 512 are, for example, the lead-free solder, and the temperature of the heating process is, for example, between 200° C. and 260° C.

In the present embodiment, before the first electronic component 210 is bonded to the circuit substrate 230, the first insulation paste 220 is first coated on the first conductive bumps 212, and before the second electronic component 510 is bonded to the first electronic component 210, the second insulation paste 520 is first coated on the second conductive bumps 512. After the first electronic component 210 is bonded to the circuit substrate 230, and the second electronic component 510 is bonded to the first electronic component 210, only one heating process is performed to complete reflowing the first conductive bumps 212 and the second conductive bumps 512, and curing the first insulation paste 220 and the second insulation paste 520. In other words, the first conductive bumps 212 and the second conductive bumps 512, for example, maintain the solid state before the heating process, and are changed into the melted state or the semi-melted state when the heating process is performed.

In the POP package process of the present embodiment, only one heating process is performed to reflow all of the conductive bumps and cure all of the insulation paste, so that process steps can be simplified to reduce a problem of poor production yield, and process equipments, materials and labour cost can be reduced to improve production efficiency.

Figure 6:
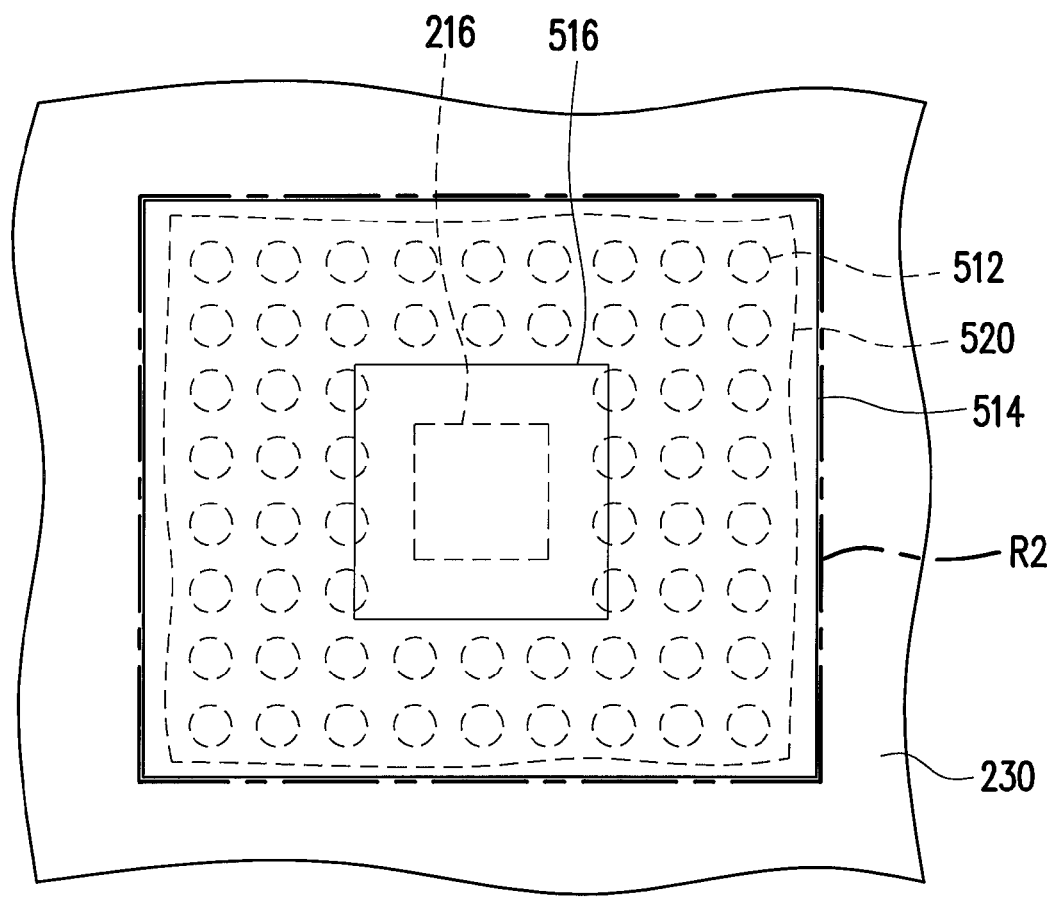
FIG. 6 is a top view of a POP structure according to an embodiment of the present application.

FIG. 6 is a top view of the POP structure of the aforementioned embodiment. As shown in FIG. 6, since in the package structure formed according to the aforementioned package process, the second insulation paste 520 is formed on the second conductive bumps 212 before the second electronic component 510 is bonded to the first electronic component 210, after the second electronic component 510 is bonded to the first electronic component 210, and the heating process is performed, the second insulation paste 520 can enter the spaces among the second conductive bumps 512 without being exposed outside the second electronic component 510. In other words, the second electronic component 510 has a second vertical projection region R2 on the first electronic component 210, and the second insulation paste 520 is located within the second vertical projection region R2. Similarly, referring to FIG. 3, the first insulation paste 220 can enter the spaces among the first conductive bumps 212 without being exposed outside the first electronic component 210. In other words, the first electronic component 210 has a first vertical projection region R on the circuit substrate 230, and the first insulation paste 220 is located within the first vertical projection region R. Therefore, a problem of remaining the underfill outside the electronic component due to the conventional dispensing step can be resolved, so that the appearance of the package structure can be greatly improved.

In summary, not only the package process of the present application has simple steps to avoid the problem of poor production yield caused by complicated process steps, but also process equipments, materials and labour cost can be reduced to improve the production yield and the production efficiency. Moreover, regarding the package structure of the present application, a problem of exposing the underfill in the conventional technique can be resolved, so that the package structure may have a better appearance.

It will be apparent to those skilled in the art that various modifications and variations can be made to the structure of the present application without departing from the scope or spirit of the application. In view of the foregoing, it is intended that the present application cover modifications and variations of this application provided they fall within the scope of the following claims and their equivalents.

What is claimed is:

1. A package process, comprising:
providing a first electronic component, and the first electronic component having a plurality of first conductive bumps on a bottom thereof;
coating a first insulation paste on the first conductive bumps by dipping the first conductive bumps into an insulation paste solution and exposing a part of an outer surface of each of the bumps from the first insulation paste;
disposing the first electronic component on a circuit substrate having a plurality of substrate pads, and the first conductive bumps being respectively situated on the substrate pads, wherein the first insulation paste covers an end surface of each of the first conductive bumps until the first conductive bumps are respectively situated on the substrate pads;
providing a second electronic component, and the second electronic component has a plurality of second conductive bumps on a bottom thereof;
coating a second insulation paste on the second conductive bumps;
disposing the second electronic component on the first electronic component, wherein the first electronic component has a plurality of first pads, and the second conductive bumps are respectively situated on the first pads; and
performing only one heating step to reflow the first conductive bumps and the second conductive bumps and cure the first insulation paste and the second insulation paste simultaneously.

2. The package process as claimed in claim 1, wherein the first conductive bumps maintain a solid state before the heating step is performed.

3. The package process as claimed in claim 2, wherein a temperature of the heating step is between 200° C. and 260° C.

4. The package process as claimed in claim 1, wherein the second conductive bumps maintain a solid state before the heating step is performed.

5. The package process as claimed in claim 4, wherein a temperature of the heating step is between 200° C. and 260° C.

6. The package process as claimed in claim 1, further comprising forming a pre-solder on each of the substrate pads before the first electronic component is disposed on the circuit substrate, so that after the first conductive bumps are reflowed, the first conductive bumps are respectively integrated with the corresponding pre-solders.

* * * * *